United States Patent
Liao et al.

(10) Patent No.: US 9,040,317 B2
(45) Date of Patent: May 26, 2015

(54) METHODS FOR ACHIEVING WIDTH CONTROL IN ETCHING PROCESSES

(75) Inventors: Keng-Ying Liao, Tainan (TW); Szu-Hung Yang, Tainan (TW); Chiung Wen Hsu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/428,925

(22) Filed: Mar. 23, 2012

(65) Prior Publication Data
US 2013/0252355 A1 Sep. 26, 2013

(51) Int. Cl.
*H01L 21/66* (2006.01)
*H01L 21/28* (2006.01)
*H01L 21/311* (2006.01)
*H01L 21/3213* (2006.01)
*H01L 21/8238* (2006.01)

(52) U.S. Cl.
CPC .... *H01L 21/28123* (2013.01); *H01L 21/31116* (2013.01); *H01L 21/32139* (2013.01); *H01L 21/823828* (2013.01); *H01L 22/26* (2013.01)

(58) Field of Classification Search
CPC .......... H01L 21/28123; H01L 21/32139; H01L 21/31116; H01L 21/823828; H01L 22/26
USPC ........................ 438/17; 156/345.25
See application file for complete search history.

(56) References Cited

U.S. PATENT DOCUMENTS

| | | | |
|---|---|---|---|
| 6,686,292 B1 * | 2/2004 | Yang et al. | 438/710 |
| 6,818,561 B1 * | 11/2004 | Sonderman | 438/706 |
| 2004/0043621 A1 * | 3/2004 | Nasser-Ghodsi | 438/710 |
| 2008/0291428 A1 * | 11/2008 | Taraboukhine | 356/72 |
| 2009/0277872 A1 * | 11/2009 | Yamamoto et al. | 216/60 |

* cited by examiner

*Primary Examiner* — Shaun Campbell
(74) *Attorney, Agent, or Firm* — Slater & Matsil, L.L.P.

(57) ABSTRACT

A method includes performing a patterning step on a layer using a process gas. When the patterning step is performed, a signal strength is monitored, wherein the signal strength is from an emission spectrum of a compound generated from the patterning step. The compound includes an element in the patterned layer. At a time the signal strength is reduced to a pre-determined threshold value, the patterning step is stopped.

17 Claims, 4 Drawing Sheets

METHODS FOR ACHIEVING WIDTH CONTROL IN ETCHING PROCESSES

BACKGROUND

In the manufacturing of integrated circuits, the control of the dimensions of the devices is important for improving the performance of the integrated circuit devices. The control of the dimensions of the devices, however, is difficult. The reason is that the widths of the resulting feature may deviate widely due to the effect of many factors, including the characteristics of the features that formed before the lithography process. Therefore, with the many factors in the preceding processes involved, it is difficult to adjust a subsequent lithography process to cancel the adverse effect of the preceding process steps.

An example of the lithography process is the etching of a gate electrode layer to form gate electrodes. The widths of the gate electrodes are important for the performance of the respective transistors. The widths of the gate electrodes thus need to be controlled carefully. The lithography process for forming the gate electrodes, however, may be affected by the factors include, but not limited to, the height difference between the top surface of the active regions (on which the gate electrodes are to be formed) and the top surface of the adjacent shallow trench isolation regions, the pre-doping concentration of the gate electrodes, the thickness of the hard mask that is used for etching the gate electrode, etc.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of controlling the widths of patterned features in lithography processes is provided in accordance with various exemplary embodiments. The intermediate stages of forming the features with the controlled widths are illustrated. The variations and the operation of the embodiments are discussed. Throughout the various views and illustrative embodiments, like reference numbers are used to designate like elements.

Figure 1:
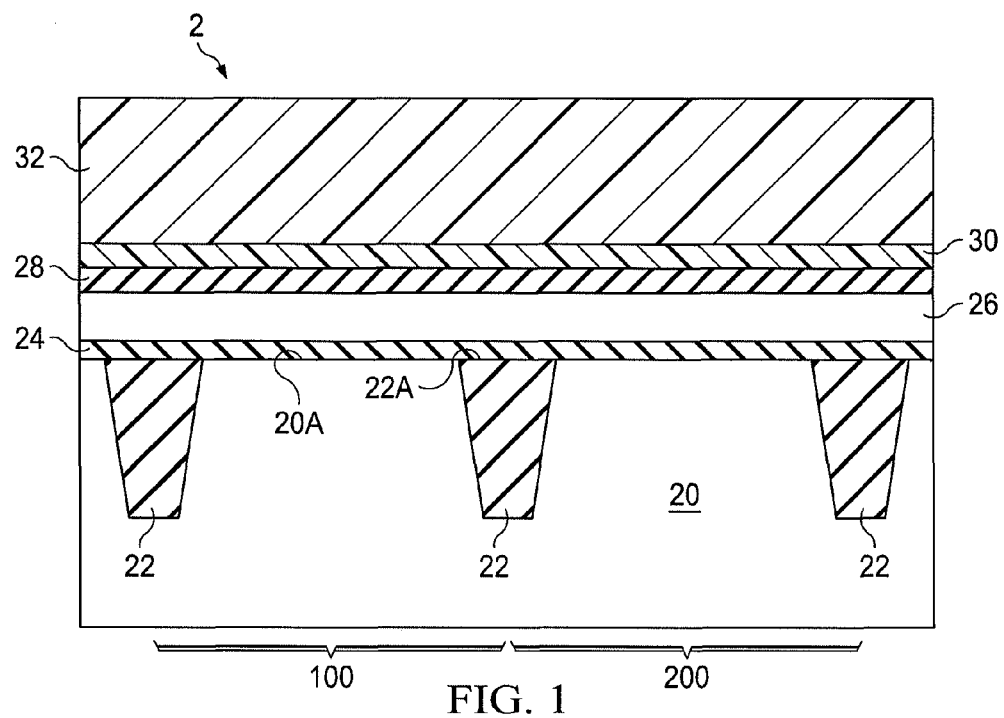
FIGS. 1 through 6 are cross-sectional views of intermediate stages in the manufacturing of gate stacks of Metal-Oxide-Semiconductor (MOS) devices in accordance with some exemplary embodiments.

Referring to FIG. 1, wafer 2, which includes substrate 20, is provided. In some embodiments, substrate 20 is a bulk silicon substrate. In alternative embodiments, substrate 20 may be formed of other semiconductor materials such as silicon carbon, silicon germanium, or the like. Substrate 20 may also be a Silicon-On-Insulator (SOI) substrate. Substrate 20 may include N-type Metal-Oxide-Semiconductor (NMOS) region 100 and P-type Metal-Oxide-Semiconductor (PMOS) region 200. Shallow-Trench-Isolation (STI) regions 22 may be formed in substrate 20, and may be used to define active regions, on which MOS devices are to be formed. Although FIG. 1 illustrates that top surface 22A of STI regions 22 is level with top surface 20A of substrate 20, top surface 22A may be higher or lower than top surface 20A.

Gate dielectric layer 24 and gate electrode layer 26 are formed over substrate 20. Gate dielectric layer 24 may include oxides, nitrides, oxynitrides, carbides, and combinations thereof. Gate electrode layer 26 is conductive, and may be formed of polysilicon. Alternatively, gate electrode layer 26 may be formed of other conductive materials such as metals, metal silicides, metal nitrides, and combinations thereof. The portions of gate electrode layer 26 in NMOS region 100 and PMOS region 200 may be doped differently. For example, the portion of gate electrode layer 26 in NMOS region 100 may be pre-doped, and the portion of gate electrode layer 26 in PMOS region 200 may not be pre-doped. Hard mask 28 is formed over gate electrode layer 26. In some embodiments, hard mask 28 comprises silicon oxynitride (SiON). Alternatively, hard mask 28 is formed of other materials such as silicon nitride.

Anti-Reflective Coating (ARC) 30 is formed over gate electrode layer 26, followed by the coating of photo resist 32. ARC 30 may absorb light, and hence may provide Critical Dimension (CD) control in the patterning of photo resist 32. The available materials of BARC 30 include organic materials and in-organic materials, which may be carbon and/or hydrogen containing materials.

Figure 2:
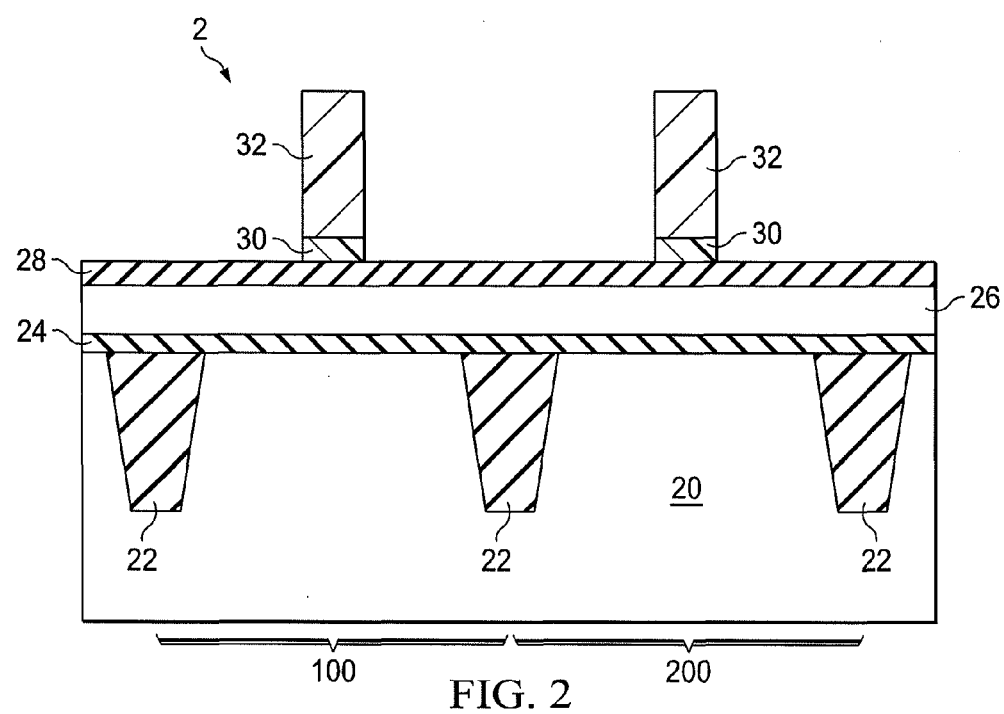

Referring to FIG. 2, photo resist 32 is patterned. The remaining portions of photo resist 32 include a portion in NMOS region 100 and a portion in PMOS region 200. Next, the patterned photo resist 32 is used to etch BARC 30, so that BARC 30 is also patterned. Accordingly, the remaining portions of BARC 30 are underlying, and substantially aligned to, the respective overlying photo resist 32.

Figure 3:
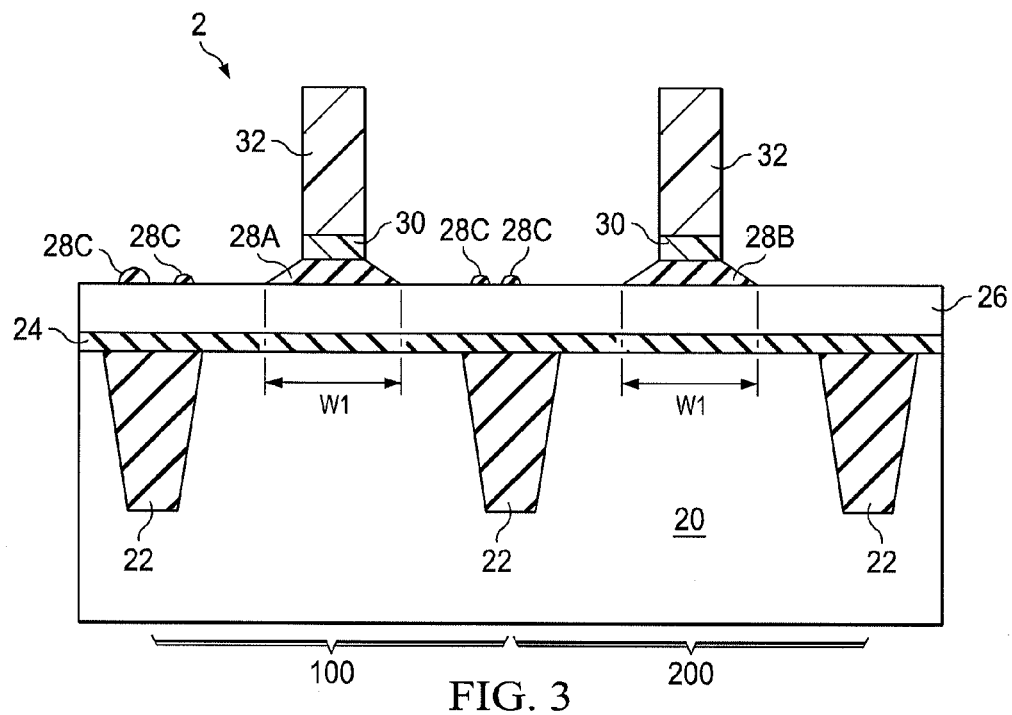
Figure 4:
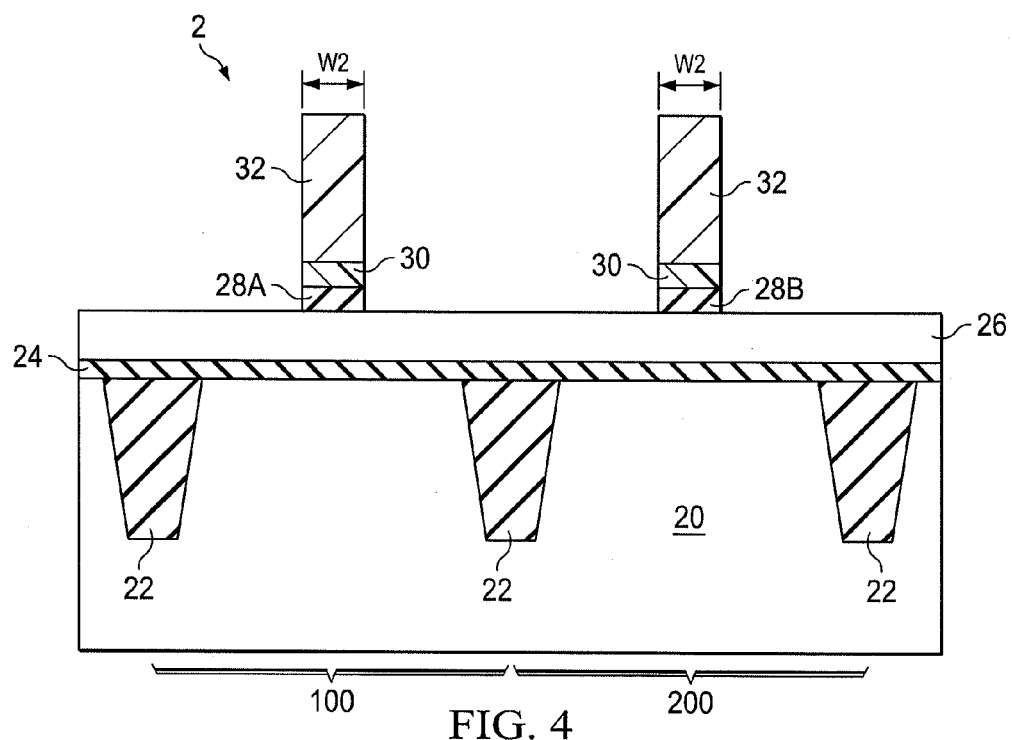
Figure 9:
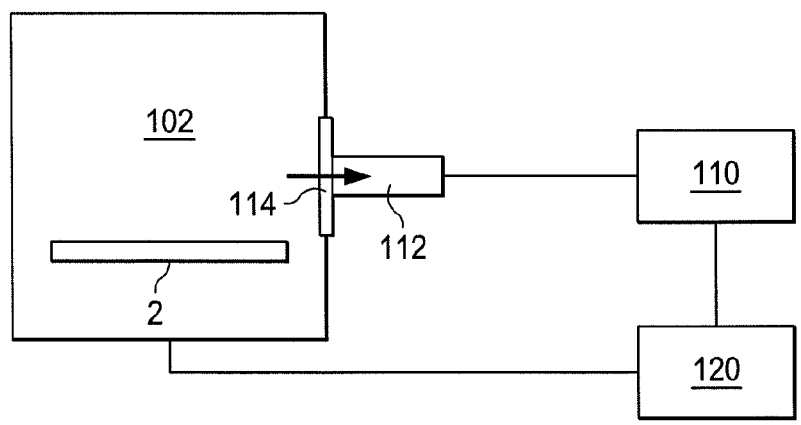
FIG. 9 schematically illustrates an apparatus for performing the steps as shown in FIGS. 1 through 5.

Next, hard mask 28 is patterned, and the remaining structure is schematically illustrated in FIGS. 3 and 4. The patterning may include an etching step followed by a trimming step. FIG. 3 schematically illustrates the resulting structure formed by the etching step. In some embodiments, the etching step is performed using a process gas comprising $CF_4$, He, $CH_2F_2$, and/or the like. The etching may be substantially anisotropic (although it may have some isotropic effects), so that portions of hard mask 28 under the remaining portions of BARC 30 and photo resist 32 are not etched, and the portions of hard mask 28 not protected by the remaining portions of BARC 30 and photo resist 32 are etched. The patterning of photo resist 32, BARC 30, and etching and the subsequent trimming of hard mask 28 may be performed in a same etcher (process chamber) 102, as illustrated in FIG. 9.

The end point of the etching of hard mask 28 is monitored, for example, using an emission spectrum analyzer. FIG. 9 illustrates Optical Emission Spectroscopy (OES) 110 as an exemplary emission spectrum analyzer. OES 110 may be connected to probe 112, which collects the photons through window 114 in the chamber (also denoted as 102) in etcher 102. In the etching and the subsequent trimming of hard mask 28, photons are emitted from the compounds in etcher 102. The photons are generated when the electrons in the compounds and the elements (which may be atoms/molecules) in etcher 102 jump to lower-energy states. Probe 112 may collect the respective photons, and send the corresponding signals to OES 110. OES 110 generates the emission spectrums of the compounds and elements from the signals received from probe 112.

The generated spectrums are the results of the elements/compounds in etcher 102, and may indicate what compounds and elements are involved in the etching and trimming, as in FIGS. 3 and 4. In the etching and the trimming of hard mask 28, the generated spectrums include the spectrum of the elements in hard mask 28, which elements may include Si, O, and N, and the spectrum of the elements in the etching process gas. Throughout the etching and the trimming of hard mask 28, the spectrums may be monitored. When the spectrums indicate that photons are emitted from the materials of gate electrode layer 26 (FIG. 3), the end point of the etching process is successfully detected. The end point means that hard mask 28 is etched through, and gate electrode layer 26 is exposed. As shown in FIG. 3, when the end point is detected, hard mask 28 have remaining portions 28A and 28B. At this time, hard mask portions 28A and 28B may have slanted edges, and some polymers and residue portions 28C may be left on the top surface of gate electrode layer 26. The widths of hard mask portions 28A and 28B at the time the end point is detected are denoted as W1.

After the end point of the etching process is detected, a trimming step is performed to trim hard mask portions 28A and 28B. The process conditions of the trimming process may be different from the process conditions of the etching step. For example, the trimming process may be more anisotropic than the etching step. In the embodiments wherein hard mask 28 comprises SiON, the process gas of the trimming may include carbon fluoride ($CF_4$), $CHF_3$, for example. In these embodiments, the nitrogen in hard mask 28 and the carbon in carbon fluoride may form a compound. The compound may include carbon-and-nitrogen containing molecules, which may be carbon nitride (CN) molecules. The carbon-and-nitrogen containing molecules emit photons, and the amount of the emitted photons indicates the amount of hard mask 28 that is being trimmed. The spectrum of the carbon-and-nitrogen containing molecules is monitored, for example, by OES 110 (FIG. 9) during the trimming process, and the signal strength of the spectrum is recorded.

In some embodiments, the signal strength of the spectrum of the carbon-and-nitrogen containing molecules is recorded at a selected time point, and the recorded signal strength is referred to as reference signal strength S1 hereinafter. In some exemplary embodiments, reference signal strength S1 may be the signal strength recorded at the starting time of the trimming process. Alternatively, reference signal strength S1 may be recorded after delay time T1 delayed from the starting time of the trimming process. In some exemplary embodiments, delay time T1 may be between about 5 seconds and about 40 seconds, although different delay times may be used.

Figure 7:
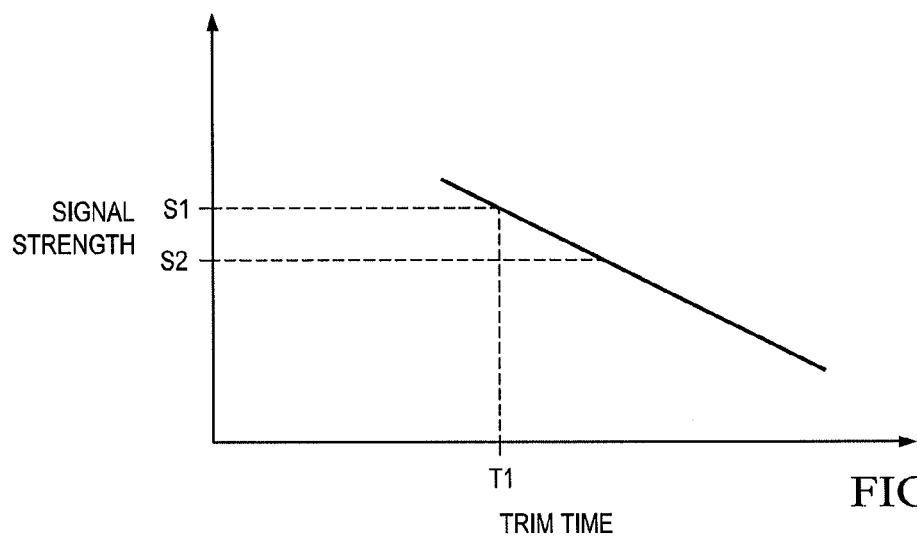
FIG. 7 illustrates signal strengths obtained in the trimming of a hard mask layer as a function of the trim times.

FIG. 7 schematically illustrates the relationship of the signal strength as a function of trimming time, which relationship is obtained from experiments. It is observed that with the proceeding of the trimming process, the signal strength of the spectrum of the carbon-and-nitrogen containing molecules reduces. A threshold signal strength S2 may be pre-determined to decide when the trimming process should stop. Threshold signal strength S2 is a function of the measured reference signal strength S1. In some exemplary embodiments, the threshold signal strength may be calculated by multiplying a pre-determined percentage with the reference signal strength S1. In some exemplary embodiments, the pre-determined percentage may be between about 80 percent and about 95 percent.

Referring to FIG. 9, to control the trimming time, control unit 120 is connected to emission spectrum analyzer 110. Control unit 120 may be a unit external to emission spectrum analyzer 110, or may be built inside emission spectrum analyzer 110. Control unit 120 receives signal strengths of the carbon-and-nitrogen containing molecules from emission spectrum analyzer 110. The received signal strengths include reference signal strength S1. During the trimming process, control unit 120 continues to monitor the signal strength through emission spectrum analyzer 110. When control unit 120 determines that the signal strength has reduced to the calculated threshold signal strength S2, control unit 120 may send a signal to etcher 102 to stop the trimming process.

Figure 8:
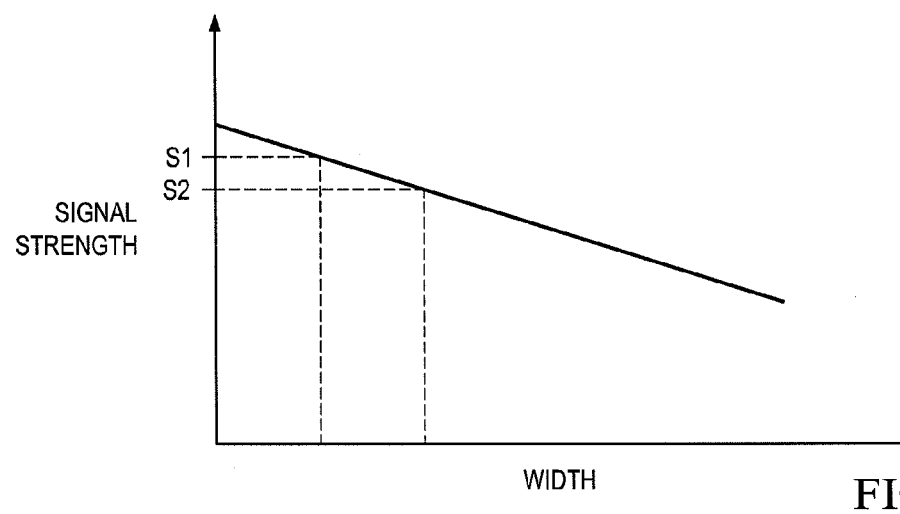
FIG. 8 illustrates signal strengths obtained in the trimming of a hard mask layer as a function of the widths of the remaining hard mask portions.

FIG. 4 illustrates the structure after the trimming process is performed. At the time the trimming process is stopped, residues 28C (FIG. 3) of hard mask 28 are removed, and the widths of hard mask portions 28A and 28B are reduced to W2, which is smaller than that before the trimming process. The optimal width W2 may be controlled through controlling the trim time. FIG. 8 schematically illustrates the signal strength as a function of the width of hard mask portions 28A and 28B. It is observe that with the proceeding of the trimming process, the width of hard mask portions 28A and 28B reduces, and there is a correlation between the width of hard mask portions 28A and 28B and the measured signal strength. Accordingly, by monitoring the signal strength, the desirable width W2 may be found.

In accordance with embodiments, to find the desirable threshold signal strength (S2) and the corresponding percentage that is used for calculating S2, sample wafers may be formed, on which the structures as shown in FIG. 1 are formed. Etching and trimming processes may be performed on each of the plurality of sample wafers, with the trimming processes on different sample wafers having different trim times. During the trimming processes, the signal strengths of the carbon-and-nitrogen containing molecules are monitored and recorded. After the trimming processes, the widths of the resulting hard masks corresponding to the different trim times are measured, so that the correlations are found. The correlations may include the correlation between the signal strengths and the trim times (FIG. 7), and/or the correlation between the signal strengths and the widths of the hard mask portions (FIG. 8). From the correlations, the threshold signal strength S2 that correspond to the desirable width of hard mask portions 28A/28B (FIG. 4) is found. The pre-determined percentage may also be determined by dividing S2 that corresponds to the desirable width W2 by the measured signal strength S1, wherein the S1 and S2 values are also measured from sample wafers. Using the threshold signal strength S2, the process steps as shown in FIGS. 1 through 4 may then be performed on production wafers, so that the widths of hard mask portions 28A and 28B may the controlled.

Figure 5:
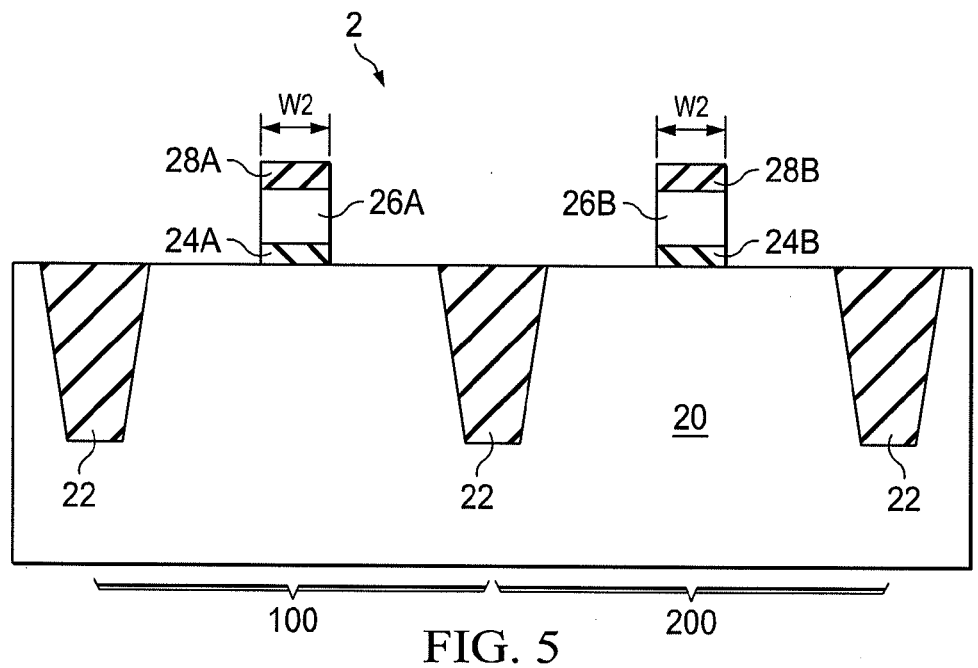

Referring to FIG. 5, photo resist 32 and BARC 30 are removed. Hard mask portions 28A and 28B are then used as an etching mask to etch the underlying gate electrode layer 26 and gate dielectric layer 24. The resulting remaining portions of gate electrode layer 26 include portions 26A and 26B in NMOS region 100 and PMOS region 200, respectively. The resulting remaining portions of gate dielectric layer 24 include portions 24A and 24B in NMOS region 100 and PMOS region 200, respectively. The etching is anisotropic, and may be a dry etching, for example. The widths of gate electrodes 26A/26B and gate dielectric 24A/24B are substantially equal to width W2, which is the widths of hard mask portions 28A and 28B. Accordingly, the widths of gate electrodes 26A and 26B are controlled through controlling the widths of hard mask portions 28A and 28B, and further through controlling the trimming process of hard mask portions 28A and 28B.

Figure 6:
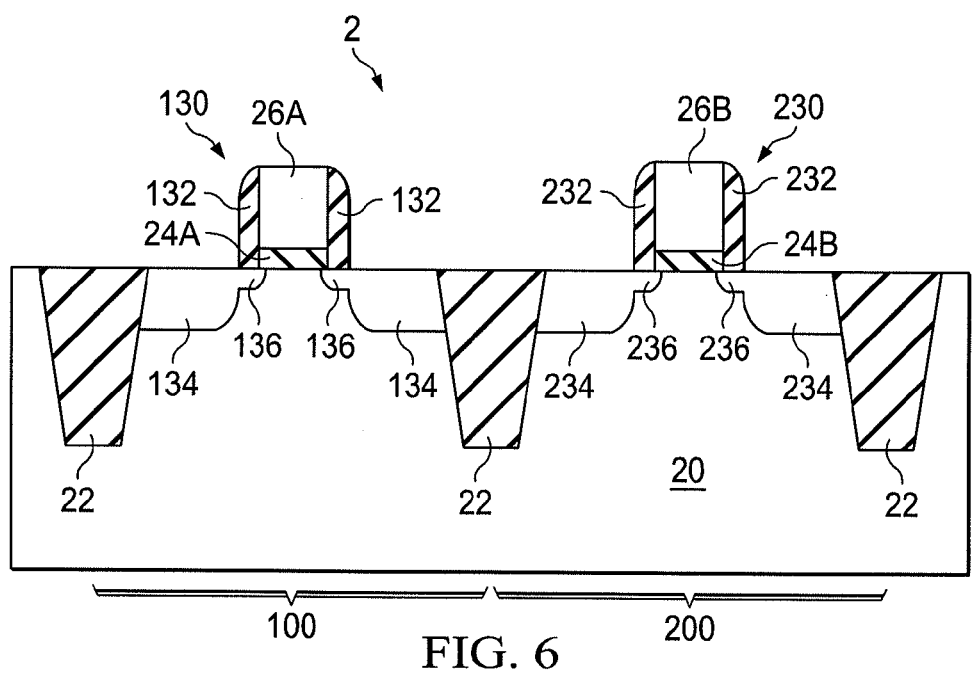

FIG. 6 illustrates the formation of the remaining portions of NMOS device 130 and PMOS device 230. NMOS device 130 may include gate spacers 132, source and drain regions 134, and source/drain extensions 136. PMOS device 230 may include gate spacers 232, source and drain regions 234, and source/drain extensions 236. Hard mask portions 28A and 28B are then removed. Silicide regions (not shown) may be formed on the surfaces of source/drain regions 134/234. In the embodiments wherein gate electrodes 26A and 26B comprise polysilicon, gate silicides (not shown) may also be formed over gate electrodes 26A and 26B.

It is appreciated that although the controlling of the width of a hard mask layer, which is used to control the widths of the gate electrodes, is discussed in the exemplary embodiments, the concept of the embodiments may be used in the lithography processes of other features other than gate electrodes. Furthermore, the controlling of the trim time may be applied to the trimming of photo resists that are used as etching masks for etching metal lines, dielectric layers, and the like.

In the embodiments, the widths of gate electrodes may be adjusted by adjusting the trimming process of the respective overlying hard masks. Therefore, the widths of the gate electrodes are substantially free from the effect of the deviations in the preceding processes. For example, the deviation may include the deviation in the height difference between top surface 20A (FIG. 1) of substrate 20 and top surface 22A of STI regions 22, the deviation in the pre-doping concentration of gate electrode layer 26, the deviation in the thickness of hard mask 28, and the like. In conventional processes, however, these deviations affect the widths of gate electrodes, and hence the etching of the hard mask layer has to take the deviations into account. In the embodiments, such deviations do not need to be considered.

In accordance with embodiments, a method includes performing a patterning step on a layer using a process gas. When the patterning step is performed, a signal strength is monitored, wherein the signal strength is from an emission spectrum of a compound generated from the patterning step. The compound includes an element in the patterned layer. At a time the signal strength is reduced to a pre-determined threshold value, the patterning step is stopped. The pre-determined threshold value may be calculated as a percentage of a recorded reference signal strength.

In accordance with other embodiments, a forming a gate electrode layer over a substrate, forming a hard mask over the gate electrode layer, forming and patterning a photo resist over the hard mask, and etching the hard mask. After the hard mask is etched through and at a certain time point, the hard mask is trimmed using a process gas, wherein the step of trimming may be more anisotropic than the step of etching. After the hard mask is etched through, a reference signal strength of an emission spectrum of a compound is recorded, wherein the compound includes a first element from the hard mask and a second element from the process gas. A threshold signal strength is calculated as a function of the reference signal strength. Upon a signal strength of the emission spectrum of the compound reducing to the threshold signal strength, the trimming is stopped. The gate electrode layer is patterned using remaining portions of the hard mask as an etching mask.

In accordance with yet other embodiments, an apparatus includes an etcher, and an emission spectrum analyzer configured to monitor emission spectrums of elements in the etcher. The Apparatus further includes a control unit connected to the emission spectrum analyzer and the etcher. The control unit is configured to receive signal strengths of the emission spectrums of the elements in the etcher, and is configured to stop the etcher in response to the received signal strengths.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
performing a patterning step on a first layer using a process gas, wherein the patterning step comprises:
an etching step for etching down the first layer; and
after the first layer is etched through, performing a trimming step on the first layer to remove parts of the first layer;
when the patterning step is performed, monitoring a signal strength from an emission spectrum of a compound generated from the patterning step, wherein the compound comprises a first element in the first layer, and wherein the signal strength is monitored during the trimming step;
monitoring an additional emission spectrum of an element in a second layer underlying the first layer, wherein the first layer and the second layer are formed of different materials;
at a time after the additional emission spectrum indicates a presence of the element in the second layer, recording a value of the signal strength;
determining a threshold value based on the recorded value of the signal strength; and
stopping the patterning step once the signal strength is reduced to the threshold value.

2. The method of claim 1 further comprising:
delaying a period of time from a starting time of the trimming step, wherein the recording the value of the signal strength is performed after delaying the period of time, wherein the threshold value is calculated by multiplying the recorded value of the signal strength with a pre-determined percentage.

3. The method of claim 1, wherein the trimming step has process conditions different from process conditions of the etching step, and wherein the trimming step is more anisotropic than the etching step.

4. The method of claim 1, wherein the first layer is a hard mask layer, and wherein the method further comprises, after the patterning step is stopped, using the hard mask as an etching mask to etch the second layer.

5. The method of claim 4, wherein the first layer is a hard mask layer, and wherein the second layer is a polysilicon layer that is over a semiconductor substrate.

6. The method of claim 4, wherein the process gas comprises a carbon containing gas, wherein the hard mask layer comprises nitrogen, and wherein the emission spectrum is a spectrum of carbon-and-nitrogen containing molecules.

7. The method of claim 1, wherein the compound further comprises a second element in the process gas.

8. A method comprising:
    forming a gate electrode layer over a substrate, wherein the gate electrode layer comprises silicon;
    forming a hard mask over the gate electrode layer, wherein the hard mask comprises a compound comprising silicon and nitrogen;
    forming and patterning a photo resist over the hard mask;
    etching the hard mask;
    after the hard mask is etched through and at a time point, starting trimming the hard mask using a process gas comprising carbon fluoride;
    after the hard mask is etched through, recording a reference signal strength of an emission spectrum of a compound, wherein the compound comprises nitrogen and carbon;
    calculating a threshold signal strength as a function of the reference signal strength;
    stopping the trimming once the signal strength of the emission spectrum of the compound reduces to the threshold signal strength; and
    patterning the gate electrode layer using remaining portions of the hard mask as an etching mask.

9. The method of claim 8, wherein the step of recording is performed after delaying a period of time from the time point.

10. The method of claim 9, wherein the period of time delayed from the time point is between about 5 seconds and about 40 seconds.

11. The method of claim 8 further comprising:
    forming a plurality of sample wafers, each comprising:
        an additional gate electrode layer over an additional substrate; and
        an additional hard mask over the additional gate electrode layer; and
    etching and trimming the additional hard masks of the plurality of sample wafers with different trimming times, wherein the compound is generated during the step of trimming;
    measuring signal strengths of the spectrum of the compound when the step of trimming the additional hard masks is performed; and
    determining a correlation between signal strengths of the spectrum of the compound and widths of the remaining portions of the additional hard masks, wherein the step of calculating the threshold signal strength is performed using the correlation.

12. The method of claim 8, wherein the step of calculating the threshold signal strength is performed by multiplying the reference signal strength with a pre-determined percentage.

13. A method comprising:
    performing a patterning step on a first layer using a process gas;
    when the patterning step is performed, monitoring a signal strength from a first emission spectrum of a compound, wherein the compound comprises a first element in the first layer and a second element in the process gas;
    monitoring a second emission spectrum of a third element in a second layer, wherein the second layer is underlying the first layer, and wherein the first layer and the second layer are formed of different materials;
    at a time after the second emission spectrum indicates a presence of the third element, recording a first value of the signal strength; and
    stopping the patterning step once the signal strength is reduced to a pre-determined second value.

14. The method of claim 13 further comprising, after the recording the first value, multiplying the first value with a pre-determined ratio to calculate the second value, wherein the pre-determined ratio is between 0 and 1.

15. The method of claim 13 further comprising:
    after the second emission spectrum indicates the presence of the third element and before starting the recording, delaying a period of time.

16. The method of claim 13 further comprising:
    after the patterning step is stopped, etching the second layer using the first layer as an etching mask, wherein the second layer forms a gate electrode of a transistor; and
    forming source and drain regions adjacent to the second layer.

17. The method of claim 13, wherein the first layer comprises silicon oxynitride, the second layer comprises polysilicon, the process gas comprises carbon fluoride, the first element comprises nitrogen, and the second element comprises carbon.

* * * * *